(12) United States Patent
Ohsuk et al.

(10) Patent No.: US 8,331,155 B2
(45) Date of Patent: Dec. 11, 2012

(54) METHOD FOR PROGRAMMING NONVOLATILE MEMORY DEVICE

(75) Inventors: Kwon Ohsuk, Yongin-si (KR); Kihwan Choi, Seongnam-si (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 299 days.

(21) Appl. No.: 12/752,225

(22) Filed: Apr. 1, 2010

(65) Prior Publication Data

US 2010/0254188 A1    Oct. 7, 2010

(30) Foreign Application Priority Data

Apr. 7, 2009   (KR) .................. 10-2009-0030008

(51) Int. Cl.
*G11C 16/04*    (2006.01)
*G11C 16/06*    (2006.01)
*G11C 16/10*    (2006.01)
*G11C 16/12*    (2006.01)

(52) U.S. Cl. ......... 365/185.18; 365/185.24; 365/185.03; 365/185.19; 365/185.22

(58) Field of Classification Search ............. 365/185.03, 365/185.18, 185.19, 185.22, 185.24
See application file for complete search history.

(56) References Cited

U.S. PATENT DOCUMENTS

| | | | |
|---|---|---|---|
| 6,366,496 B1 * | 4/2002 | Torelli et al. ............. | 365/185.19 |
| 7,400,532 B2 | 7/2008 | Aritome | |
| 2007/0097747 A1 * | 5/2007 | Li et al. .................... | 365/185.17 |

FOREIGN PATENT DOCUMENTS

| KR | 100763353 B1 | 9/2007 |
|---|---|---|
| KR | 1020080085158 A | 9/2008 |

* cited by examiner

*Primary Examiner* — J. H. Hur
(74) *Attorney, Agent, or Firm* — Volentine & Whitt, PLLC

(57) ABSTRACT

A method programs a nonvolatile memory device to program memory cells from one or more first logic states to two or more second logic states. In the method, a number of program voltages are provided to a selected word line, and verify voltages corresponding to the second logic states are provided to the selected word line. The number of the program voltages provided to the selected word line varies according to the threshold voltage difference between each of the first logic states and each of the second logic states.

6 Claims, 12 Drawing Sheets

METHOD FOR PROGRAMMING NONVOLATILE MEMORY DEVICE

CROSS-REFERENCE TO RELATED APPLICATIONS

A claim of priority under 35 U.S.C. §119 is made to Korean Patent Application No. 10-2009-0030008, filed Apr. 7, 2009, the entire contents of which are hereby incorporated by reference.

BACKGROUND

The present disclosure herein relates to semiconductor memory devices, and more particularly, to nonvolatile memory devices, program methods thereof, and memory systems including the same.

Semiconductor memory devices, which store data and enable the stored data to be read, are generally classified as either volatile memory devices or nonvolatile memory devices.

The volatile memory devices lose data stored therein when power supply thereto is interrupted. Examples of the volatile memory devices include static random access memory (SRAM) devices, dynamic random access memory (DRAM) devices, and synchronous dynamic random access memory (SDRAM) devices. Nonvolatile memory devices retain data stored therein even when power supply thereto is interrupted. Examples of the nonvolatile memory devices include read-only memory (ROM) devices, programmable read-only memory (PROM) devices, erasable programmable read-only memory (EPROM) devices, electrically erasable programmable read-only memory (EEPROM) devices, flash memory devices, phase-change random access memory (PRAM) devices, magnetic random access memory (MRAM) devices, resistive random access memory (RRAM) devices, and ferroelectric random access memory (FRAM) devices. Among these nonvolatile memory devices, flash memory devices may be generally classified as either NOR-type flash memory devices or NAND-type flash memory devices.

SUMMARY

In some embodiments of the inventive concepts, a method is provided for programming a nonvolatile memory device to program memory cells from one or more first logic states to two or more second logic states. The method includes providing a number of program voltages to a selected word line, and providing verify voltages corresponding to the second logic states to the selected word line. The number of the program voltages provided to the selected word line varies according to the threshold voltage difference between each of the first logic states and each of the second logic states.

In some embodiments, the providing of the program voltages to the selected word line includes providing two or more program voltages to the selected word line when the threshold voltage difference between each of the first logic states and each of the second logic states is greater than a reference value.

In other embodiments, the providing of the program voltages to the selected word line includes providing one program voltage to the selected word line when the first logic states include an erase state and the second logic states include an erase state and a program state.

In further embodiments, the providing of the program voltages to the selected word line includes providing first and second program voltages to the selected word line sequentially when the first logic states include an erase state and a first program state and the second logic states include an erase state and second to fourth program states.

In still further embodiments, the first program voltage is provided to program the memory cells having the erase state among the first logic states to the second program state.

In still further embodiments, the second program voltage is provided to program the memory cells having the first program state to the third or fourth program state.

In still further embodiments, the providing of the program voltages to the selected word line includes providing one program voltage to the selected word line when the first logic states include an erase state and first to third program states and the second logic states include an erase state and fourth to tenth program states.

In still further embodiments, the method further includes increasing the level of the program voltage when there are program-failed memory cells, and providing the program voltage with the increased level to the selected word line.

In other embodiments of the inventive concepts, a method for programming a nonvolatile memory device is provided which includes executing an $(n-1)^{th}$ bit program operation (n: a natural number) of memory cells, and executing an $n^{th}$ bit program operation of the memory cells. A threshold voltage of the memory cells varies by a first variation in the $(n-1)^{th}$ bit program operation, and the threshold voltage of the memory cells varies by a second variation in the $n^{th}$ bit program operation. The number of program voltages provided in one program loop of the $n^{th}$ bit program operation and the number of program voltages provided in one program loop of the $(n-1)^{th}$ bit program operation vary according to the first and second variations.

In some embodiments, when the first variation is greater than the second variation by a predetermined value, the number of program voltages provided in one program loop of $(n-1)^{th}$ bit program operation is greater than the number of program voltages provided in one program loop of the $n^{th}$ bit program operation.

In other embodiments of the inventive concepts, a method for programming a nonvolatile memory device is provided which includes upon programming least significant bits to memory cells, receiving program data, determining a number of program voltages based on the received program data, applying the determined number of the program voltages to memory cells, and verifying the memory cells. The number of the program voltages are determined based on a sequence of the program data from the least significant bits.

In further embodiments, the applying the determined number of the program voltages includes applying the determined number of the program voltages to the memory cells without verifying the memory cells.

In still further embodiments, the determined number of the program voltages have different levels respectively.

In still further embodiments, when the sequence of the data to be programmed from the least significant bit increase, a number of the determined number of the program voltages decrease.

BRIEF DESCRIPTION OF THE DRAWINGS

The accompanying drawings are included to provide a further understanding of the inventive concepts, and are incorporated in and constitute a part of this specification. The drawings illustrate exemplary embodiments of the inventive concepts and, together with the description, serve to explain principles of the inventive concepts. In the drawings.

DETAILED DESCRIPTION OF THE EMBODIMENTS

Preferred embodiments of the inventive concepts will be described below in more detail with reference to the accompanying drawings. The inventive concepts may, however, be embodied in different forms and should not be construed as limited to the embodiments set forth herein. Rather, these embodiments are provided so that this disclosure will be thorough and complete, and will fully convey the scope of the inventive concepts to those skilled in the art.

Figure 1:
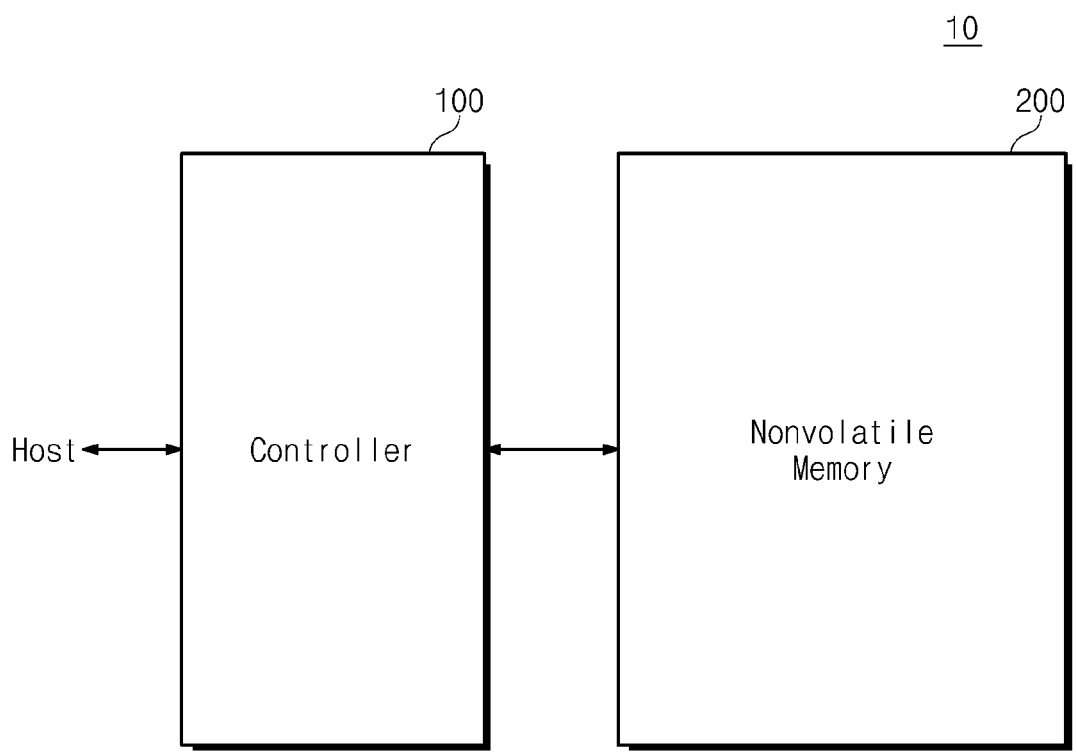
FIG. 1 is a block diagram of a memory system according to an embodiment of the inventive concepts.

FIG. 1 is a block diagram of a memory system 10 according to an embodiment of the inventive concepts.

Referring to FIG. 1, a memory system 10 according to an embodiment of the inventive concepts includes a controller 100 and a nonvolatile memory device 200.

The controller 100 is connected to a host and the nonvolatile memory device 200. The controller 100 transfers data, read from the nonvolatile memory device 200, to the host and stores data, received from the host, in the nonvolatile memory device 200.

The controller 100 may include a random access memory (RAM), a processing unit, a host interface, and a memory interface. The RAM may be used as a working memory of the processing unit. The processing unit may control an overall operation of the controller 100.

The host interface may include a protocol for data exchange between the host and the controller 100. For example, the controller 100 may be configured to communicate with an external device (e.g., the host) through one of various interface protocols such as USB (Universal Serial Bus), MMC (Multimedia Card), PCI (Peripheral Component Interface), PCI-E (PCI-Express), ATA (Advanced Technology Attachment), Serial-ATA, Parallel-ATA, SCSI (Small Computer Small Interface), ESDI (Enhanced Small Disk Interface), and IDE (Integrated Drive Electronics).

The memory interface may interface with the nonvolatile memory device 200. The controller 100 may further include an error correction block. The error correction block may be configured to detect and correct an error in data read from the nonvolatile memory device 200.

The nonvolatile memory device 200 may include a memory cell array for storing data, a read/write circuit for reading/writing data from/in the memory cell array, an address decoder for decoding an address received from an external device and transferring the same to the read/write circuit, and a control logic circuit for controlling an overall operation of the nonvolatile memory device 200. The nonvolatile memory device 200 according to an exemplary embodiment will be described later in detail with reference to FIG. 2.

The controller 100 and the nonvolatile memory device 200 may be integrated into one semiconductor device. As an example, the controller 100 and the nonvolatile memory device 200 may be integrated into one semiconductor device to constitute a memory card. For example, the controller 100 and the nonvolatile memory device 200 may be integrated into one semiconductor device to constitute a PC card (e.g., PCMCIA (Personal Computer Memory Card International Association)), a compact flash card (CF), a smart media card (SM/SMC), a memory stick, a multimedia card (e.g., MMC, RS-MMC and MMCmicro), a SD card (e.g., SD, miniSD, and microSD), or a universal flash storage (UFS).

As another example, the controller 100 and the nonvolatile memory device 200 may be integrated into one semiconductor device to constitute a solid state disk/drive (SSD). When the memory system 10 is used as an SSD, the operation speed of the host connected to the memory system 10 may substantially increase.

As another example, the memory system 10 may be applicable to computers, portable computers, laptop computers, UMPCs (Ultra Mobile PCs), net-books, PDAs, web tablets, wireless phones, mobile phones, smart phones, digital cameras, digital audio recorders/players, digital picture/video recorders/players, devices capable of transmitting/receiving information in wireless environments, one of various electronic devices constituting a home network, one of various electronic devices constituting a computer network, one of various electronic devices constituting a telematics network, or one of various components constituting a solid state driver (SSD) or a computing system (e.g., a memory card).

As another example, the nonvolatile memory device 200 or the memory system 10 may be mounted in various types of packages. Examples of packages of the nonvolatile memory device 200 or the memory system 10 include Package on Package (PoP), Ball Grid Arrays (BGA), Chip Scale Packages (CSP), Plastic Leaded Chip Carrier (PLCC), Plastic Dual In-line Package (PDIP), Die in Waffle Pack, Die in Wafer Form, Chip On Board (COB), Ceramic Dual In-line Package (CERDIP), Plastic Metric Quad Flat Pack (MQFP), Thin Quad Flat Pack (TQFP), Small Outline Integrated Circuit (SOIC), Shrink Small Outline Package (SSOP), Thin Small Outline Package (TSOP), System In Package (SIP), Multi Chip Package (MCP), Wafer-level Fabricated Package (WFP), and Wafer-level Processed Stack Package (WSP).

Hereinafter, for the sake of simplicity, a NAND flash memory device is exemplified in the description of the inventive concepts. However, the inventive concepts are not limited to a NAND flash memory device. For example, the inventive concepts may be applicable to other nonvolatile memory devices including ROMs, PROMs, EPROMs, EEPROMs, flash memories, PRAMs, MRAMs, RRAMs, and FRAMs.

Figure 2:
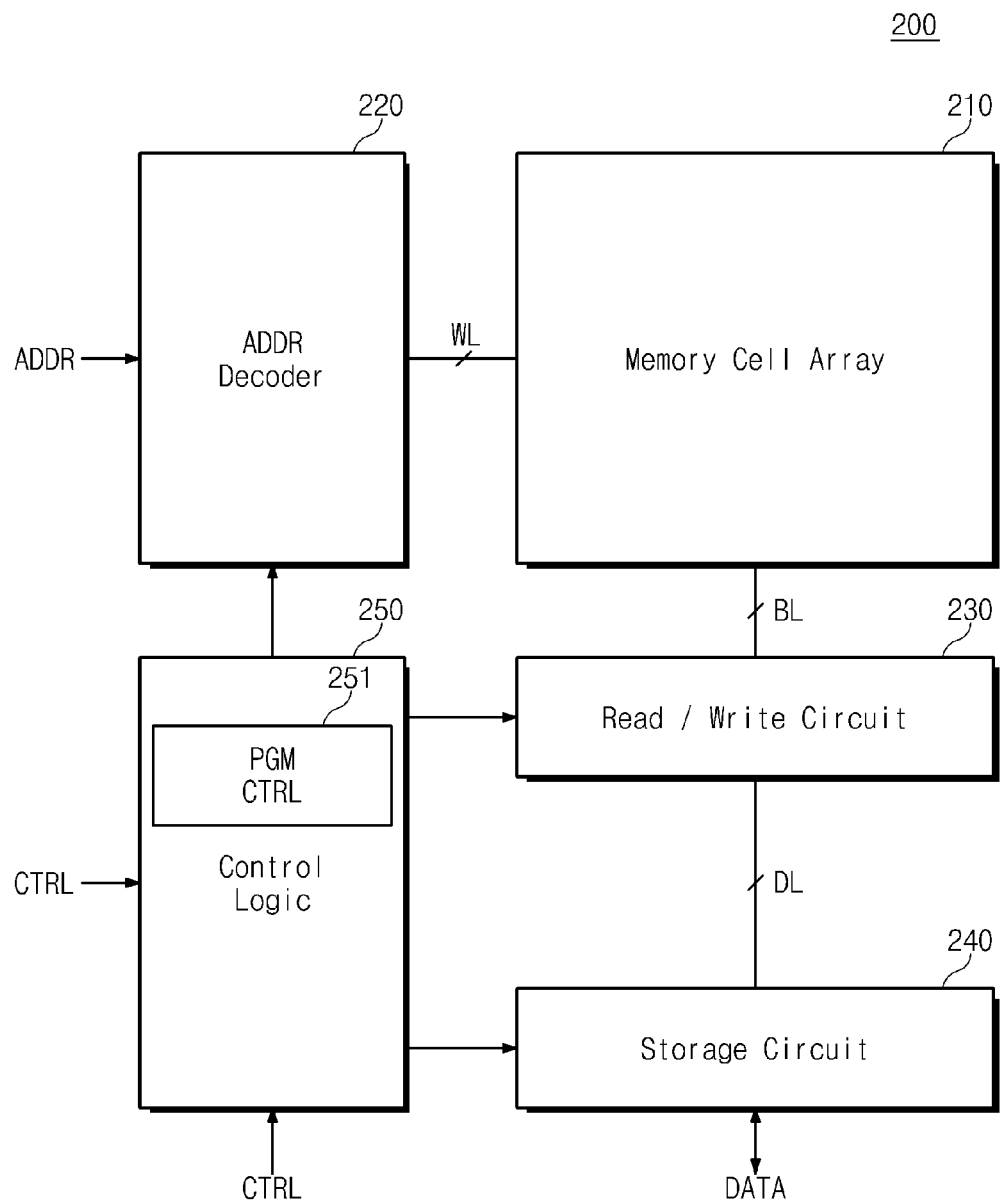
FIG. 2 is a block diagram of a nonvolatile memory device illustrated in FIG. 1.

FIG. 2 is a block diagram of the nonvolatile memory device 200 illustrated in FIG. 1.

Referring to FIG. 2, the nonvolatile memory device 200 according to an exemplary embodiment includes a memory cell array 210, an address decoder 220, a read/write circuit 230, a storage circuit 240, and a control logic circuit 250.

The memory cell array 210 is connected through word lines WL to the address decoder 220 and is connected through bit lines BL to the read/write circuit 230. The memory cell array 210 includes a plurality of memory cells. For example, the rows of the memory cells are connected to the word lines WL, and the columns of the memory cells are connected to the bit lines BL. The memory cells are configured to store one bit per cell or two or more bits per cell. The memory cell array 210 will be described later in detail with reference to FIG. 3.

The address decoder 220 is connected through the word lines WL to the memory cell array 210. The address decoder 220 operates in response to the control of the control logic circuit 250. The address decoder 220 receives an address ADDR from an external device. For example, the address ADDR is received from the controller 100 of FIG. 1.

The address decoder 220 decodes a row address among the received addresses ADDR to select the word lines WL. The address decoder 220 decodes a column address among the received addresses ADDR and transfers the same to the read/write circuit 230. For example, the address decoder 220 includes a row decoder, a column decoder, and an address buffer.

The read/write circuit 230 is connected through the bit lines BL to the memory cell array 210 and is connected through data lines DL to the storage circuit 240. The read/write circuit 230 operates in response to the control of the control logic circuit 250. The read/write circuit 230 selects the bit lines BL in response to the column address received from the address decoder 220.

For example, the read/write circuit 230 stores data, received from the storage circuit 240, in the memory cell array 210. As another example, the read/write circuit 230 transfers data, read from the memory cell array 210, to the storage circuit 240. As another example, the read/write circuit 230 stores data, read from a first storage region of the memory cell array 210, in a second storage region of the memory cell array 210. For example, the read/write circuit 230 performs a copy-back operation.

For example, the read/write circuit 230 includes a page buffer and a column selection circuit. As another example, the read/write circuit 230 includes a sense amplifier, a write driver, and a column selection circuit.

The storage circuit 240 is connected through the data lines DL to the read/write circuit 230. The storage circuit 240 operates in response to the control of the control logic circuit 250. The storage circuit 240 exchanges data with an external device. For example, the storage circuit 240 exchanges data with the controller 100 of FIG. 1. Data received from an external device are transferred through the data lines DL to the read/write circuit 230. Data received from the read/write circuit 230 are outputted to an external device. For example, the storage circuit 240 includes a data buffer.

The control logic circuit 250 is connected to the address decoder 220, the read/write circuit 230, and the storage circuit 240. The control logic circuit 250 controls an overall operation of the nonvolatile memory device 200. The control logic circuit 250 operates in response to a control signal CTRL received from an external device. For example, the control signal CTRL is received from the controller 100 of FIG. 1. The control logic circuit 250 includes a program controller 251. The program controller 251 is configured to control a program operation of the memory cell array 210. An operation of the program controller 251 will be described later in detail with reference to FIGS. 4 to 11.

In FIG. 2, the program controller 251 is illustrated as being a component of the control logic circuit 250. However, the inventive concepts are not limited thereto. For example, the program controller 251 may be separated from the control logic circuit 250.

For example, the program controller 251 is implemented by the hardware of a digital circuit, an analog circuit, or a combination thereof. As another example, the program controller 251 is implemented by software driven in the nonvolatile memory device 200. As another example, the program controller 251 is implemented iby a combination of hardware and software.

Figure 3:
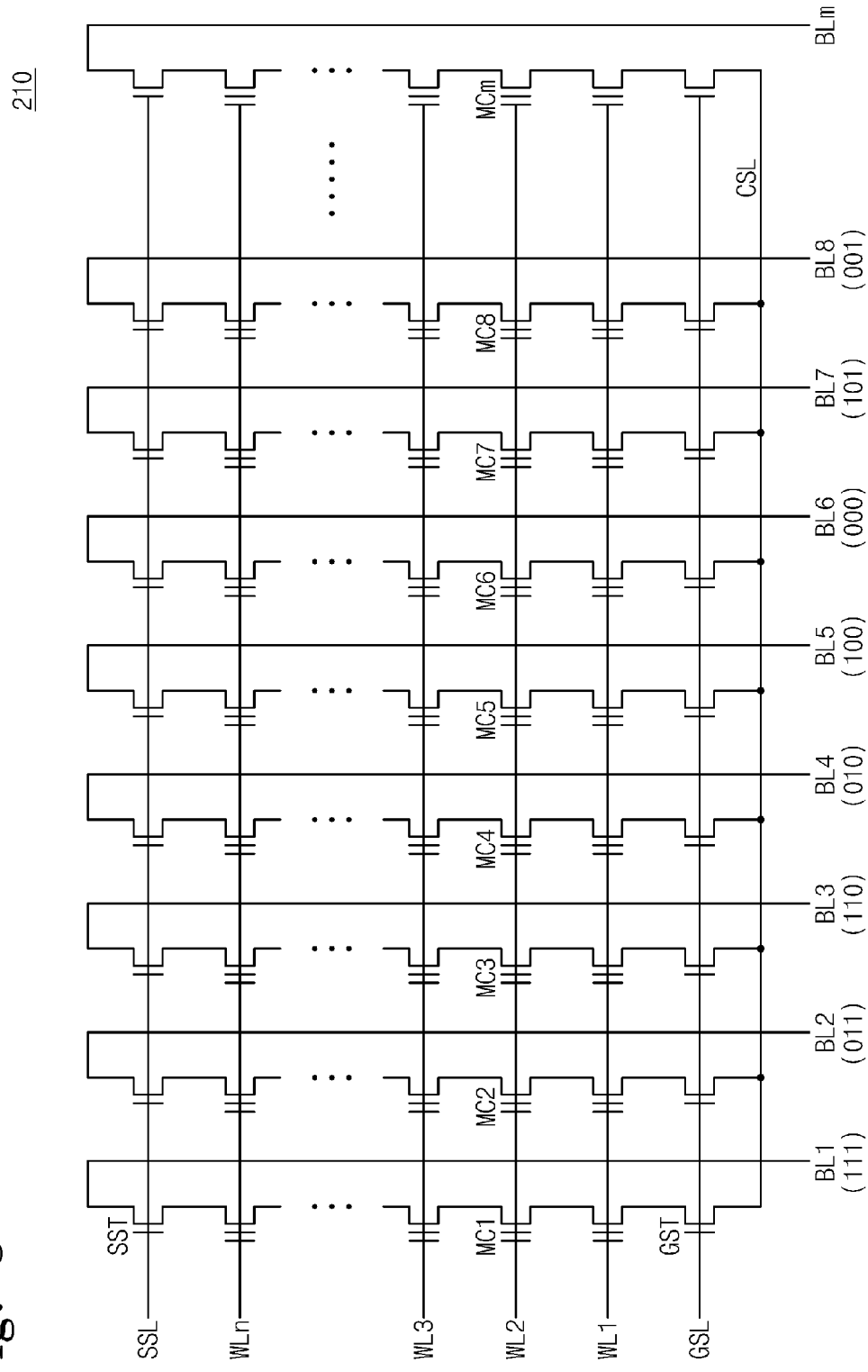
FIG. 3 is a block diagram of a memory cell array illustrated in FIG. 2.

FIG. 3 is a block diagram of the memory cell array 210 illustrated in FIG. 2.

For example, the memory cell array 210 includes a plurality of memory blocks. For the sake of simplicity, only one memory block of the memory cell array 210 is illustrated in FIG. 3. For example, one memory block of a memory cell array of a NAND flash memory device is illustrated in FIG. 3. However, as mentioned previously, it will be understood that the nonvolatile memory device 200 is not limited to a NAND flash memory device.

Referring to FIG. 3, a plurality of memory cells are connected in series to form a string structure. The memory cell array 210 includes a plurality of strings each including memory cells connected in series. A string selection transistor SST is connected between a memory cell string and a corresponding bit line. A ground selection transistor GST is connected between a memory cell string and a common source line CSL.

Rows of the memory cells are connected to word lines WL1~WLn. For example, the row including memory cells MC1~MCm is connected to the word line WL2. The string selection transistors SST are connected to a string selection line SSL. The ground selection transistors GST are connected to a ground selection line GSL. The word lines WL1~WLn, the ground selection line GSL and the string selection line SSL may be connected to the address decoder 220 of FIG. 2. Columns of the memory cells are connected to bit lines BL1~BLm. For example, the bit lines are connected to the string selection transistors SST connected to the columns of the memory cells. The bit lines BL1~BLm may be connected to the read/write circuit 230 of FIG. 2.

For example, it is assumed that the memory cells MC1~MCm can store 3 bits per cell. In this case, least significant bits LSB stored in the memory cells MC1~MCm form a least significant page. Central significant bits CSB stored in the memory cells MC1~MCm form a central significant page. Most significant bits MSB stored in the memory cells MC1~MCm form a most significant page.

For example, it is assumed that the memory cells MC1~MCm connected to the word line WL2 are selected for a program operation. For example, it is assumed that '111', '011', '110', '010', '100', '000', '101' and '001' are programmed respectively in the memory cells MC1, MC2, MC3, MC4, MC5, MC6, MC7 and MC8 as illustrated in FIG. 3.

Figure 4:
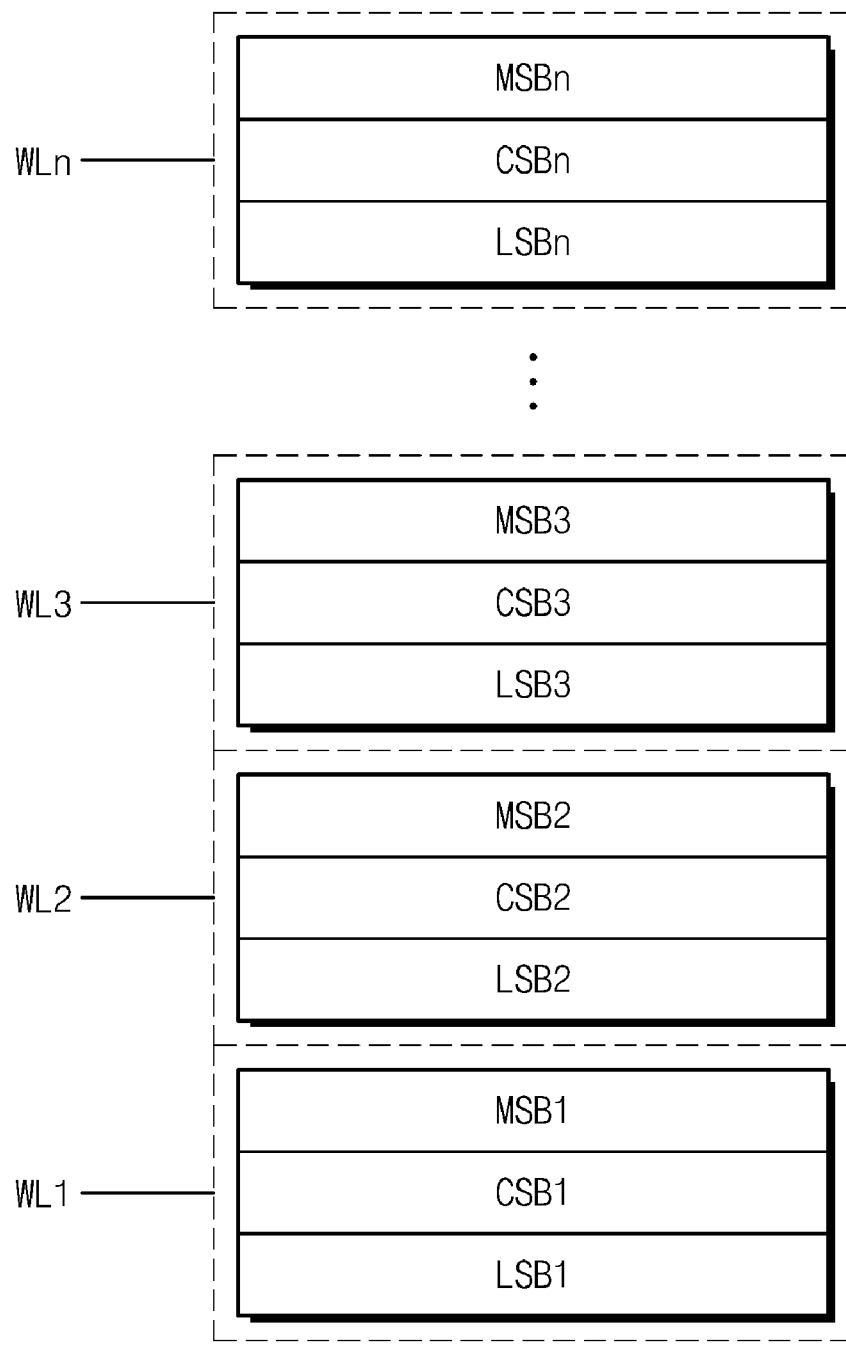
FIG. 4 is a block diagram illustrating the pages of a memory cell array that stores 3 bits per cell.

FIG. 4 is a block diagram illustrating the pages of the memory cell array 210 that stores 3 bits per cell.

In FIG. 4, the illustration of the memory cells is omitted for the sake of simplicity.

Referring to FIGS. 3 and 4, the memory cells connected to the word line WL1 form 3 pages LSB1, CSB1 and MSB1. The memory cells connected to the word line WL2 form 3 pages LSB2, CSB2 and MSB2. The memory cells connected to the word line WL3 form 3 pages LSB3, CSB3 and MSB3. The memory cells connected to the word line WLn form 3 pages LSBn, CSBn and MSBn.

The nonvolatile memory device 200 is not limited to having 3 bits per cell. For example, the nonvolatile memory device 200 may be configured to store 'p' bits per cell (p: any natural number). In this case, it will be understood that the memory cells connected to each word line may form 'p' pages.

Figure 5:
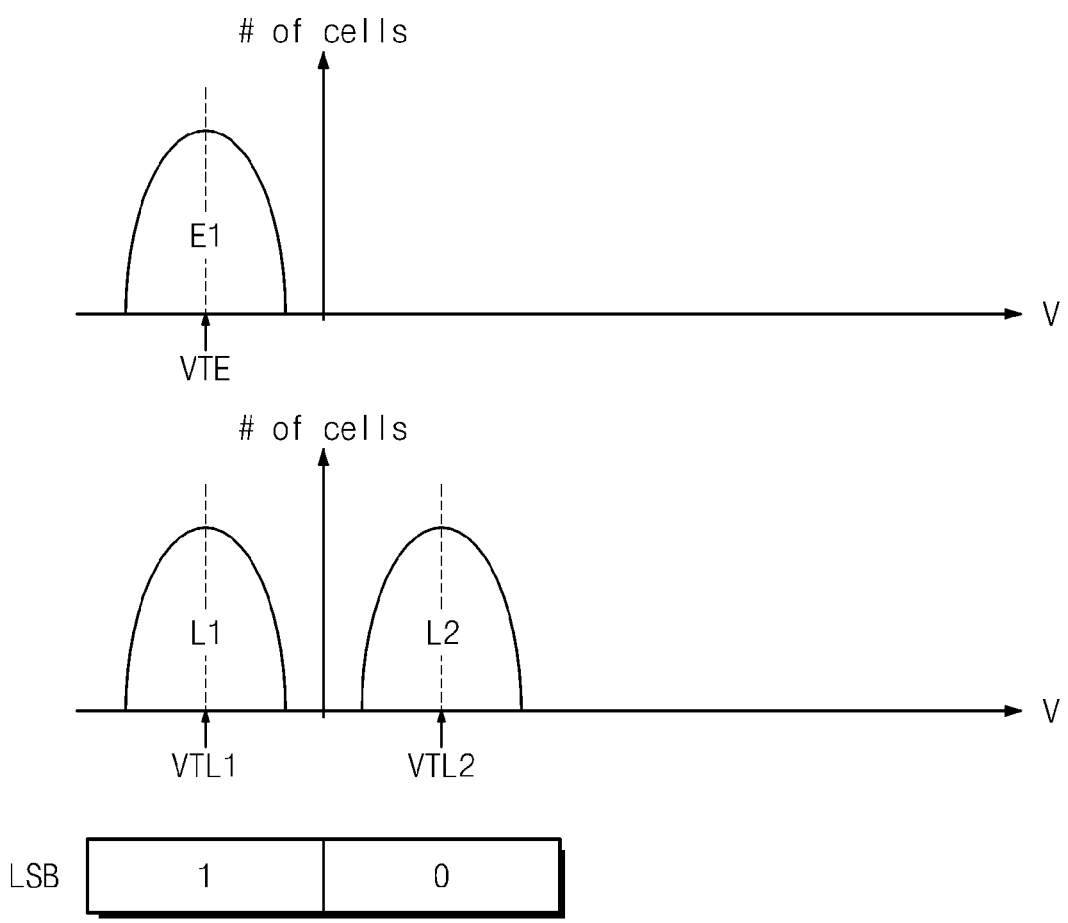
FIG. 5 is a diagram illustrating an operation of programming the least significant bits LSB in memory cells.

FIG. 5 is a diagram illustrating an operation of programming the least significant bits LSB in the memory cells MC1~MCm.

Referring to FIGS. 3 to 5, before the programming of the least significant bits LSB, the memory cells MC1~MCm have at least one logic state E1. For example, the memory cells MC1~MCm have an erase state E1. For example, it is assumed that the average value of the threshold voltages of the memory cells with the erase state E1 is a voltage VTE.

The memory cells with the least significant bits LSB programmed have at least two logic states L1 and L2. For example, the memory cells MC1~MCm have an erase state L1 and a program state L2. The erase state L1 represents a least significant bit '1', and the program state L2 represents a least significant bit '0'. For example, as described with reference to FIG. 3, the memory cells MC1, MC2, MC7 and MC8 may be programmed to the erase state L1 and the memory cells MC3~MC6 may be programmed to the program state L2. A verify voltage VL1 is used to program the least significant bit '0'. For example, it is assumed that the average value of the threshold voltages of the memory cells with the erase state L1 is a voltage VTL1. For example, it is assumed that the average value of the threshold voltages of the memory cells with the program state L2 is a voltage VTL2.

Table 1 below shows the memory cells MC1~MCm with the least significant bits LSB programmed.

TABLE 1

|     | MC1 | MC2 | MC3 | MC4 | MC5 | MC6 | MC7 | MC8 |
|-----|-----|-----|-----|-----|-----|-----|-----|-----|
| LSB | 1   | 1   | 0   | 0   | 0   | 0   | 1   | 1   |

In the following description, a variation in the threshold voltages of the memory cells will be the average value of variations in the memory cells programmed. For example, it will be understood that a variation in the threshold voltages of the memory cells MC1, MC2, MC7 and MC8 programmed from the erase state E1 to the logic state L2 of the least significant bit LSB is the difference (VTL2−VTE) between the voltage VTL2 and the voltage VTE.

Figure 6:
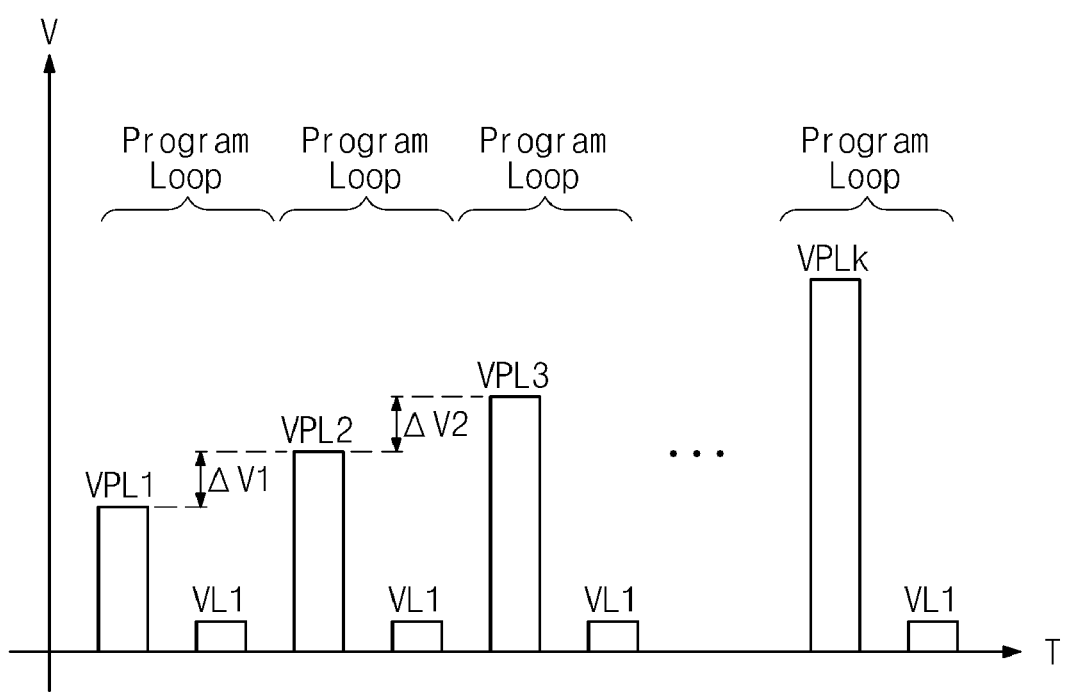
FIG. 6 is a diagram illustrating the program voltages and the verify voltages in the LSB program operation of FIG. 5.

FIG. 6 is a diagram illustrating the program voltages and the verify voltages in the LSB program operation of FIG. 5.

In FIG. 6, the axis of abscissas represents a time T and the axis of ordinates represents the level of a voltage V.

Referring to FIGS. 3 to 6, a program start voltage VPL1 is provided as the program voltage to the selected word line WL2. Thereafter, the verify voltage VL1 is provided to the selected word line WL2.

If there is a program-failed memory cell, the level of the program voltage increases by a voltage level ΔV1 from a level VPL1 to a level VPL2. Also, the increased program voltage VPL2 is provided to the selected word line WL2. Thereafter, the verify voltage VL1 is provided to the selected word line WL2.

If there is a program-failed memory cell, the level of the program voltage increases by a voltage level ΔV2 from the level VPL2 to a level VPL3. Also, the increased program voltage VPL3 is provided to the selected word line WL2. Thereafter, the verify voltage VL1 is provided to the selected word line WL2.

The applying of the program voltage to the selected word line and the applying of the verify voltage to the selected word line form one program loop. At each iteration of the program loop, the program voltage increases by a predetermined value. That is, an incremental step pulse program (ISPP) operation is performed. The program loop will iterate until all the memory cells MC1~MCm pass in programming or until the program loop is performed a predetermined number of times. For example, FIG. 6 illustrates that the program loop iterates until the program voltage reaches a level VPLk.

The program operation ends if the memory cells to be programmed to the logic state L2 of the least significant bit LSB pass in programming. That is, a coupling will not occur in the memory cells that have passed in programming to the logic state L2.

Figure 7:
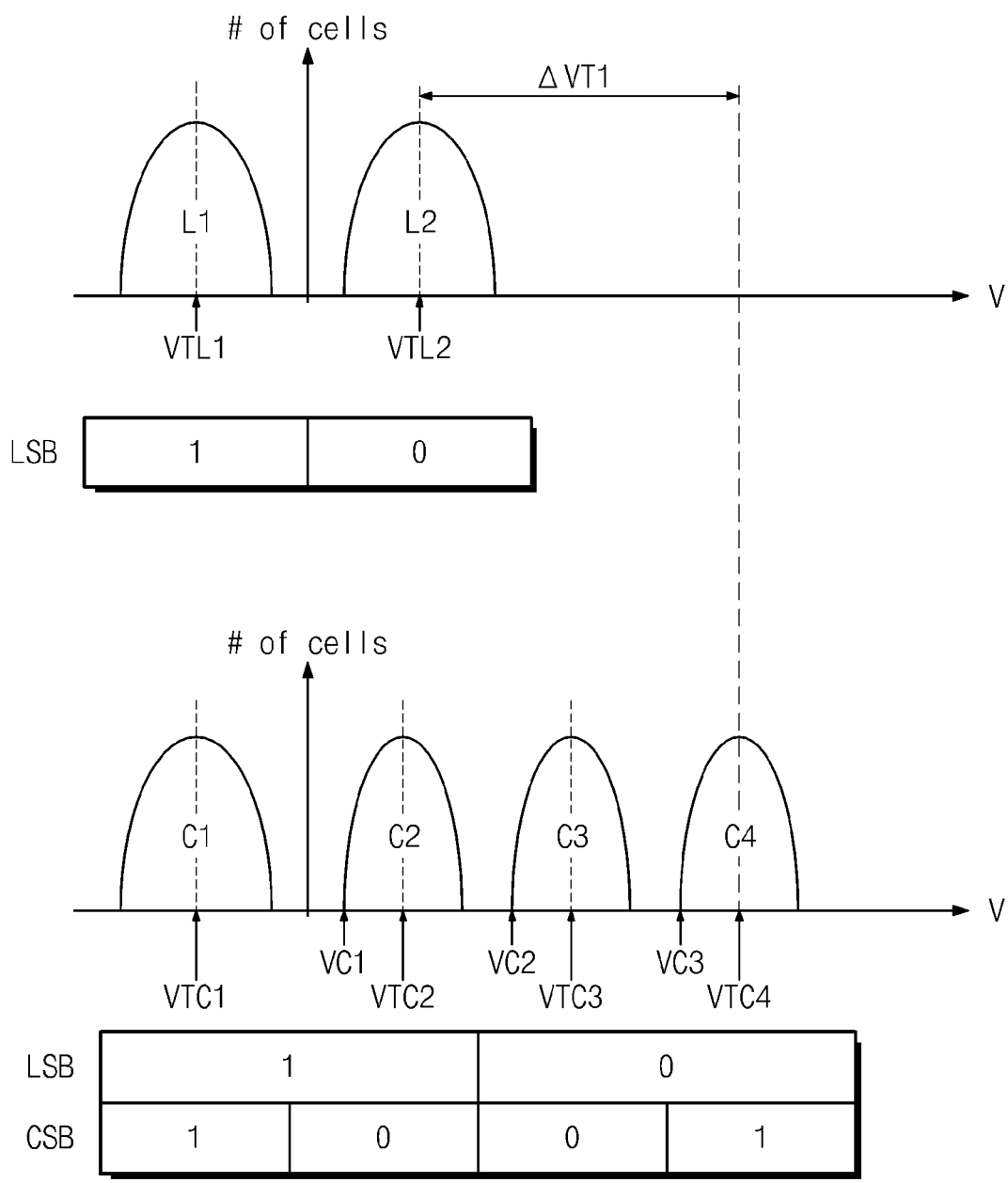
FIG. 7 is a diagram illustrating an operation of programming the central significant bits CSB in memory cells.

FIG. 7 is a diagram illustrating an operation of programming the central significant bits CSB in the memory cells.

Referring to FIGS. 3, 4 and 7, the memory cells MC1~MCm before programming have at least one logic state. For example, the memory cells MC1~MCm have an erase state L1 and a program state L2. That is, the memory cells MC1~MCm are stored with least significant bit (LSB) data. When the central significant bits CSB are programmed, the memory cells MC1~MCm have at least two logic states. For example, the memory cells MC1~MCm have an erase state C1 and program states C2~C4.

The memory cells may be programmed from the logic state L1 (the LSB '1') of the least significant bit LSB to the logic state C1 (the CSB '1') of the central significant bit CSB or the logic state C2 (the CSB '0') of the central significant bit CSB. When the memory cells are programmed from the logic state L1 of the least significant bit LSB to the logic state C1 of the central significant bit CSB, the threshold voltages of the memory cells is maintained. When the memory cells are programmed from the logic state L1 of the least significant bit LSB to the logic state C2 of the central significant bit CSB, a variation in the threshold voltages of the memory cells is the difference (VTC2−VTL1) between a voltage VTC2 and a voltage VTL1.

The memory cells will be programmed from the logic state L2 (the LSB '0') of the least significant bit LSB to the logic state C3 (the CSB '0') of the central significant bit CSB or the logic state C4 (the CSB '1') of the central significant bit CSB. When the memory cells are programmed from the logic state L2 of the least significant bit LSB to the logic state C3 of the central significant bit CSB, a variation in the threshold voltages of the memory cells is the difference (VTC3−VTL2) between a voltage VTC3 and a voltage VTL2. When the memory cells are programmed from the logic state L2 of the least significant bit LSB to the logic state C4 of the central significant bit CSB, a variation in the threshold voltages of the memory cells is the difference (VTC4−VTL2) between a voltage VTC4 and the voltage VTL2.

A threshold voltage variation ΔVT1 of the memory cells MC1~MCm in the CSB program operation is greatest when the memory cells MC1~MCm are programmed from the logic state L2 of the least significant bit LSB to the logic state C4 of the central significant bit CSB. That is, in the CSB program operation, the coupling effect from the memory cells programmed from the logic state L2 of the least significant bit LSB to the logic state C4 of the central significant bit CSB is the greatest.

For example, as described with reference to FIG. 3, the memory cells MC1~MC4 may be programmed to have the CSB '1'. The memory cells MC5~MC8 may be programmed to have the CSB '0'. Table 2 below shows the states of the memory cells with the least significant bits LSB and the central significant bits CSB programmed.

TABLE 2

|     | MC1 | MC2 | MC3 | MC4 | MC5 | MC6 | MC7 | MC8 |
|-----|-----|-----|-----|-----|-----|-----|-----|-----|
| LSB | 1   | 1   | 0   | 0   | 0   | 0   | 1   | 1   |
| CSB | 1   | 1   | 1   | 1   | 0   | 0   | 0   | 0   |

For example, it is assumed that one program voltage is used to perform the CSB program operation. The memory cells MC1 and MC2 programmed from the logic state of the least significant bit LSB to the logic state C1 of the central significant bit CSB are program-inhibited. The other memory cells MC3~MC8 are programmed by the program voltage. For example, the memory cells MC3~MC8 are programmed by ISPP.

The memory cell is programmed according to the value that is equal to the voltage, applied to a control gate of the memory cell, minus the threshold value of the memory cell and the channel voltage of the memory cell. That is, when one program voltage is applied, the program speed of the memory cell increases with a decrease in the threshold voltage of the memory cell.

As illustrated in FIG. 7, the threshold voltage of the memory cells corresponding to the logic state L1 of the least significant bit LSB is lower than the threshold voltage of the memory cells corresponding to the logic state L2 of the least significant bit LSB. Thus, the threshold voltage of the memory cells programmed from the logic state L1 increases faster than the threshold voltage of the memory cells programmed from the logic state L2.

Thus, the memory cells MC7 and MC8 programmed from the logic state L1 of the least significant bit LSB to the logic state C2 of the central significant bit CSB may be programmed earlier than the other memory cells MC3~MC6. Thereafter, the programmed-passed memory cells MC7 and MC8 are program-inhibited.

Thereafter, the memory cells MC5 and MC6 programmed to the logic state C3 are program-passed and program-inhibited. Thereafter, the memory cells MC3 and MC4 programmed to the logic state C4 are program-passed.

That is, a program operation is further performed on the memory cells MC3~MC6 to be programmed to the logic states C3 and C4 of the central significant bit CSB, after the memory cells MC7 and MC8 programmed to the logic state C2 of the central significant bit CSB. Thus, the memory cells MC7 and MC8 programmed to the logic state C2 may be affected by the coupling effect (specifically, the F-poly coupling effect) from the memory cells MC3~MC6 programmed to the logic states C3 and C4.

A variation (VC2−VL1) in the threshold voltage of the memory cells MC5 and MC6 programmed from the logic state L2 of the least significant bit LSB to the logic state C3 of the central significant bit CSB may cause a coupling (specifically, an F-poly coupling) to the adjacent memory cells MC1~MC4 and MC7~MCm. A variation ANT1 in the threshold voltage of the memory cells MC3 and MC4 programmed from the logic state L2 of the least significant bit LSB to the logic state C4 of the central significant bit CSB may cause a coupling (specifically, an F-poly coupling) to the adjacent memory cells MC1, MC2 and MC5~MCm.

For example, the threshold voltage of the memory cells programmed to the logic state C2 of the central significant bit CSB may increase by the F-poly coupling from the memory cells programmed to the logic states C3 and C4. For example, the threshold voltage of the memory cells programmed to the logic state C3 may increase by the F-poly coupling from the memory cells programmed to the logic state C4. For example, in the CSB program operation, the coupling effect transferred from the memory cells programmed to the logic state C4 to the memory cells programmed to the logic state C2 may be greatest. It will be understood that the memory cells programmed to the logic states C2 and C3 may be program-disturbed by the coupling effect.

In order to prevent the program disturbance by the coupling effect, the nonvolatile memory device according to inventive concepts utilizes at least two program voltages to perform the CSB program operation.

Figure 8:
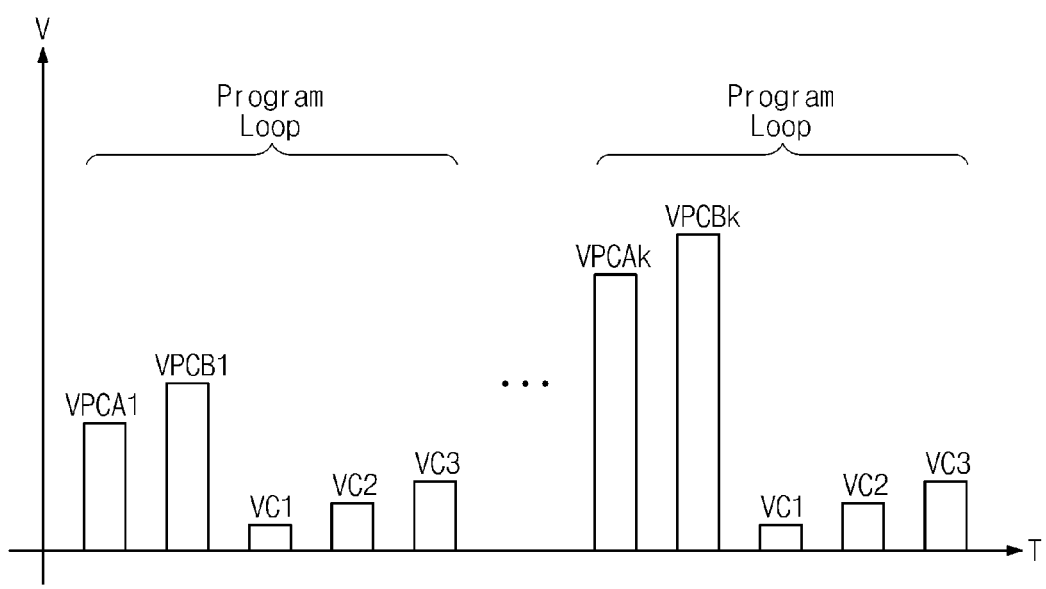
FIG. 8 is a diagram illustrating the program voltages and the verify voltages in the CSB program operation of FIG. 7.

FIG. 8 is a diagram illustrating the program voltages and the verify voltages in the CSB program operation of FIG. 7.

In FIG. 8, the axis of abscissas represents a time T and the axis of ordinates represents the level of a voltage V.

Referring to FIGS. 3, 4, 7 and 8, two program start voltages VPCA1 and VPCB1 are provided as the program voltage to the selected word line WL2. Also, verify voltages VC1~VC3 are provided to the selected word line WL2. The verify voltage VC1 are used to determine the pass/fail of the memory cells programmed to the logic state C2. The verify voltage VC2 are used to determine the pass/fail of the memory cells programmed to the logic state C3. The verify voltage VC3 are used to determine the pass/fail of the memory cells programmed to the logic state C4. Thereafter, the levels of the program voltages VPCA1 and VPCB1 increase and the program loop iterates. That is, an ISPP program operation is performed.

The program operation will iterate until all the memory cells MC1~MCm pass in programming or until the program loop is performed a predetermined number of times. For example, FIG. 8 illustrates that the program loop iterates until the program voltages respectively reach a level VPCAk and a level VPCBk. As described above, the program voltages and the verify voltages provided to the selected word line WL2 form one program loop.

For example, the program voltages VPCA1~VPCAk may be used to program the memory cells to the logic state C2. For example, the memory cells MC7 and MC8 may be programmed when the program voltages VPCA1~VPCAk are provided to the selected word line WL2. Also, the memory cells MC3~MC6 may be program-inhibited when the program voltages VPCA1~VPCAk are provided to the selected word line WL2.

For example, the program voltages VPCB1~VPCBk may be used to program the memory cells to the logic states C2 and C4. For example, the memory cells MC3~MC6 may be programmed when the program voltages VPCB1~VPCBk are provided to the selected word line WL2. Also, the memory cells MC7 and MC8 may be program-inhibited when the program voltages VPCB1~VPCBk are provided to the selected word line WL2.

For example, the program voltage (one of VPCB1~VPCBk) may have a level between the level for programming the logic state C3 and the level for programming the logic state C4. For example, when the program voltage (one of VPCB1~VPCBk) is applied to the selected word line WL2, a positive voltage may be applied to the bit lines BL5 and BL6 corresponding to the memory cells MC5 and MC6 to be programmed to the logic state C3. The positive voltage applied to the bit lines BL5 and BL6 will have a lower level than a voltage for program-inhibiting the memory cells MC5 and MC6. That is, the memory cells MC5 and MC6 may not be program-inhibited by the positive voltage applied to the bit lines BL5 and BL6.

When the positive voltage is applied to the bit lines BL5 and BL6, the channels of the memory cells MC5 and MC6 are also be biased by a positive voltage. The difference between the control gate voltage and the channel voltage of the memory cells MC5 and MC6 will be smaller than the level of the program voltage (one of VPCB1~VPCBk). That is, in the memory cells MC5 and MC6, the program effect by the program voltage (one of VPCB1~VPCBk) decreases. Thus, the memory cells MC5 and MC6 may be prevented from being over-programmed due to the program voltage (one of VPCB1~VPCBk) with a level higher than the level of a program voltage for programming the memory cells MC5 and MC6 to the logic state C3.

A ground voltage (Vss) may be applied to the bit lines BL3 and BL4 corresponding to the memory cells MC3 and MC4 to be programmed to the logic state C4. That is, the memory cells MC3 and MC4 may be programmed by the program voltage (one of VPCB1~VPCBk).

In the CSB program operation, the threshold voltage of the memory cells with the logic state L1 of the least significant bit LSB may increase by the program voltage (one of VPCA1~VPCAk). Also, the threshold voltage of the memory cells with the logic state L2 of the least significant bit LSB may increase by the program voltage (one of VPCB1~VPCBk). In one program loop, the program voltage (one of VPCA1~VPCAk) for programming the memory cells to the logic state C2 and the program voltage (one of VPCB1~VPCBk) for programming the memory cells to the logic states C3 and C4 are sequentially applied. Also, the level of a first program voltage (one of VPCA1~VPCAk) applied in one program loop is lower than the level of a second program voltage (one of VPCB1~VPCBk).

That is, in one program loop, the threshold voltage of the memory cells programmed from the logic state L1 of the least significant bit LSB to the logic state C2 of the central significant bit CSB increases by the first program voltage (one of VPCA1~VPCAk). Also, in the program loop, the threshold voltage of the memory cells programmed from the logic state L1 of the least significant bit LSB to the logic states C3 and C4 of the central significant bit CSB increases by the second program voltage (one of VPCB1~VPCBk).

As illustrated in FIG. 7, the average value VTL1 of the threshold voltages of the memory cells programmed from the logic state L1 of the least significant bit LSB is greater than the average value VTL2 of the threshold voltages of the memory cells programmed from the logic state L2 of the least significant bit LSB. In one program loop, the first program voltage (one of VPCA1~VPCAk) provided to the memory cells programmed from the logic state L1 is higher than the second program voltage (one of VPCB1~VPCBk) provided to the memory cells programmed from the logic state L2. Thus, an increment in the threshold voltage of the memory cells programmed from the logic state L1 will be similar to an increment in the threshold voltage of the memory cells programmed from the logic state L2. Thus, a program operation on the memory cells MC7 and MC8 programmed to the logic state C2 and a program operation on the memory cells MC3~MC6 programmed to the logic states C3 and C4 may be completed at similar times.

For example, the memory cells MC7 and MC8 may be programmed to the logic state C2, the memory cells MC5 and MC6 may be programmed to the logic state C3, and then the memory cells MC3 and MC4 may be programmed to the logic state C4.

As another example, the memory cells MC5 and MC6 may be programmed to the logic state C3, the memory cells MC7 and MC8 may be programmed to the logic state C2, and then the memory cells MC3 and MC4 may be programmed to the logic state C4.

As another example, the memory cells MC5 and MC6 may be programmed to the logic state C3, the memory cells MC3 and MC4 may be programmed to the logic state C4, and then the memory cells MC7 and MC8 may be programmed to the logic state C2.

When the memory cells MC3~MCm are programmed at similar times, the degree of an increase in the threshold voltage of the programmed memory cells may decrease due to the coupling from the memory cells programmed. That is, the nonvolatile memory device 200 provides at least two program voltages to the selected word line WL2 in one program loop of the CSB program operation, thus reducing the coupling effect. It will be understood that more than two program voltages may be provided to the selected word line WL2 in one program loop of the CSB program operation.

Figure 9:
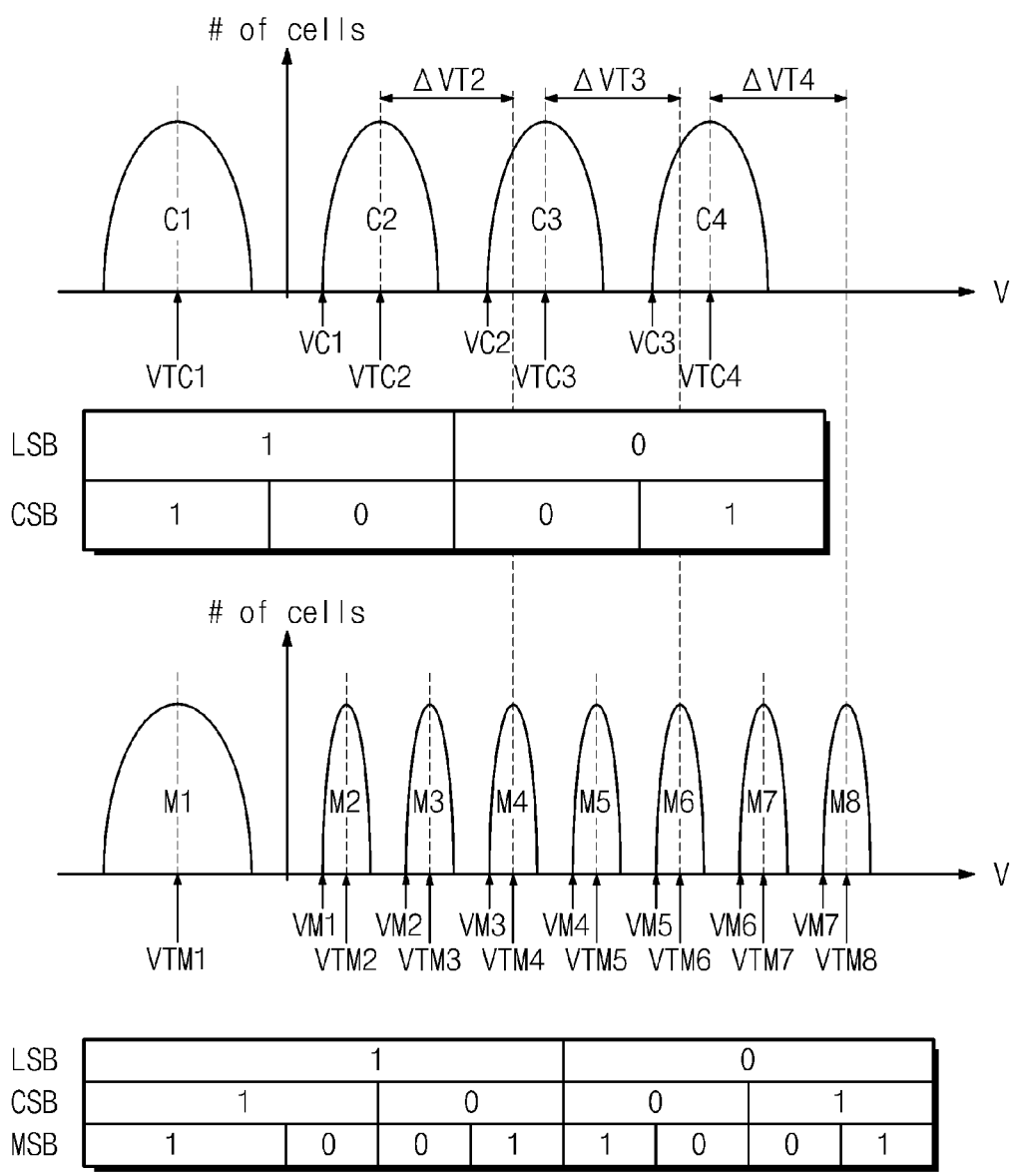
FIG. 9 is a diagram illustrating an operation of programming the most significant bits MSB in memory cells.

FIG. 9 is a diagram illustrating an operation of programming the most significant bits MSB in the memory cells.

Referring to FIGS. 3, 4 and 9, the memory cells MC1~MCm before programming have at least one logic state. For example, the memory cells MC1~MCm may have an erase state L1 and program states C2~C4. That is, the memory cells MC1~MCm may be stored with least significant bit (LSB) data and central significant bit (CSB) data. When the central significant bits CSB are programmed, the memory cells MC1~MCm may have at least two logic states. For example, the memory cells MC1~MCm may have an erase state C1 and program states C2~C4.

For example, it is assumed that the average value of the threshold voltages of a logic state M1 of the most significant bit MSB is a voltage VTM1. It is assumed that the average value of the threshold voltages of a logic state M2 is a voltage VTM2. It is assumed that the average value of the threshold voltages of a logic state M3 is a voltage VTM3. It is assumed that the average value of the threshold voltages of a logic state M4 is a voltage VTM4. It is assumed that the average value of the threshold voltages of a logic state M5 is a voltage VTM5. It is assumed that the average value of the threshold voltages of a logic state M6 is a voltage VTM6. It is assumed that the average value of the threshold voltages of a logic state M7 is a voltage VTM7. It is assumed that the average value of the threshold voltages of a logic state M8 is a voltage VTM8.

The memory cells may be programmed from the logic state C1 (the LSB '1' and the CSB '1') of the central significant bit CSB to the logic state M1 (the MSB '1') of the most significant bit MSB or the logic state M2 (the MSB '0') of the most significant bit MSB. When the memory cells are programmed from the logic state C1 of the central significant bit CSB to the logic state M1 of the most significant bit MSB, the threshold voltages of the memory cells are maintained. When the memory cells are programmed from the logic state C1 of the central significant bit CSB to the logic state M2 of the most significant bit MSB, a variation in the threshold voltages of the memory cells is the difference (VTM2−VTC1) between the voltage VTM2 and the voltage VTC1.

The memory cells may be programmed from the logic state C2 (the LSB '1' and the CSB '0') of the central significant bit CSB to the logic state M3 (the MSB '0') of the most significant bit MSB or the logic state M4 (the MSB '1') of the most significant bit MSB. When the memory cells are programmed from the logic state C2 of the central significant bit CSB to the logic state M3 of the most significant bit MSB, a variation in the threshold voltages of the memory cells is the difference (VTM3−VTC2) between the voltage VTM3 and the voltage VTC2. When the memory cells are programmed from the logic state C2 of the central significant bit CSB to the logic state M4 of the most significant bit MSB, a variation in the threshold voltages of the memory cells is the difference (VTM4−VTC2, or ΔVT2) between the voltage VTM4 and the voltage VTC2.

The memory cells may be programmed from the logic state C3 (the LSB '0' and the CSB '0') of the central significant bit CSB to the logic state M5 (the MSB '1') of the most significant bit MSB or the logic state M6 (the MSB '0') of the most significant bit MSB. When the memory cells are programmed from the logic state C3 of the central significant bit CSB to the logic state M5 of the most significant bit MSB, a variation in the threshold voltages of the memory cells is the difference (VTM5−VTC3) between the voltage VTM5 and the voltage VTC3. When the memory cells are programmed from the logic state C3 of the central significant bit CSB to the logic state M6 of the most significant bit MSB, a variation in the threshold voltages of the memory cells is the difference (VTM6−VTC3, or ΔVT3) between the voltage VTM6 and the voltage VTC3.

The memory cells may be programmed from the logic state C4 (the LSB '0' and the CSB '1') of the central significant bit CSB to the logic state M7 (the MSB '0') of the most significant bit MSB or the logic state M8 (the MSB '1') of the most significant bit MSB. When the memory cells are programmed from the logic state C4 of the central significant bit CSB to the logic state M7 of the most significant bit MSB, a variation in the threshold voltages of the memory cells is the difference (VTM7−VTC4) between the voltage VTM7 and the voltage VTC4. When the memory cells are programmed from the logic state C4 of the central significant bit CSB to the logic state M8 of the most significant bit MSB, a variation in the threshold voltages of the memory cells is the difference (VTM8−VTC4, or ΔVT4) between the voltage VTM8 and the voltage VTC4.

For example, as described with reference to FIG. 3, the memory cells MC1, MC3, MC5 and MC7 may be programmed to have the MSB '1'. The memory cells MC2, MC4, MC6 and MC8 may be programmed to have the MSB '0'. Table 3 below shows the states of the memory cells with the least significant bit LSB, the central significant bits CSB and the most significant bits MSB programmed.

TABLE 3

|     | MC1 | MC2 | MC3 | MC4 | MC5 | MC6 | MC7 | MC8 |
|-----|-----|-----|-----|-----|-----|-----|-----|-----|
| LSB | 1   | 1   | 0   | 0   | 0   | 0   | 1   | 1   |
| CSB | 1   | 1   | 1   | 1   | 0   | 0   | 0   | 0   |
| MSB | 1   | 0   | 1   | 0   | 1   | 0   | 1   | 0   |

The greater of the variations in the threshold voltages of the memory cells programmed from the logic state C2 of the central significant bit CSB is ΔVT2. The greater of the variations in the threshold voltages of the memory cells programmed from the logic state C3 of the central significant bit CSB is ΔVT3. The greater of the variations in the threshold voltages of the memory cells programmed from the logic state C4 of the central significant bit CSB is ΔVT4.

The variation (ΔVT2, ΔVT3 or ΔVT4) in the threshold voltages of the memory cells in the MSB program operation is smaller than the variation (ANT1) in the threshold voltages of the memory cells in the CSB program operation. That is, the coupling effect in the MSB program operation will be smaller than the coupling effect in the CSB program operation.

If the threshold voltage variation in the MSB program operation is smaller than a predetermined value (i.e., if the coupling effect is smaller than a predetermined amount), the program operation can be performed by providing one program voltage to the selected word line WL2 in one program loop of the MSB program operation. That is, if the threshold voltage variation is smaller than the predetermined value, it is possible to reduce the number of program voltages provided to the selected word line WL in one program loop.

Figure 10:
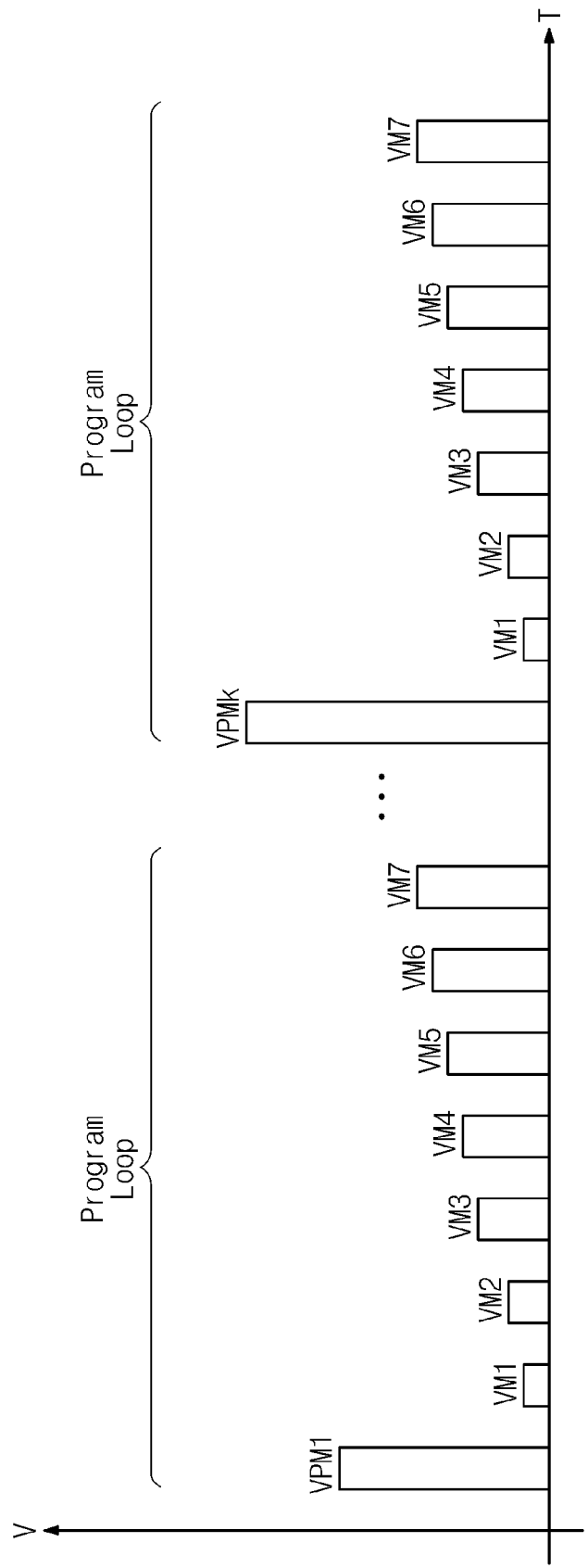
FIG. 10 is a diagram illustrating the program voltages and the verify voltages in the MSB program operation of FIG. 9.

FIG. 10 is a diagram illustrating the program voltages and the verify voltages in the MSB program operation of FIG. 9.

In FIG. 10, the axis of abscissas represents a time T and the axis of ordinates represents the level of a voltage V.

Referring to FIGS. 3, 4, 9 and 10, a program start voltage VPM1 is provided as the program voltage to the selected word line WL2. Also, verify voltages VM1~VM7 are provided to the selected word line WL2. The verify voltage VM1 may be used to determine the pass/fail of the memory cells programmed to the logic state M2. The verify voltage VM2 may be used to determine the pass/fail of the memory cells programmed to the logic state M3. The verify voltage VM3 may be used to determine the pass/fail of the memory cells programmed to the logic state M4. The verify voltage VM4 may be used to determine the pass/fail of the memory cells programmed to the logic state M5. The verify voltage VM5 may be used to determine the pass/fail of the memory cells programmed to the logic state M6. The verify voltage VM6 may be used to determine the pass/fail of the memory cells programmed to the logic state M7. The verify voltage VM7 may be used to determine the pass/fail of the memory cells programmed to the logic state M8. Thereafter, an ISPP program operation may be performed.

The program operation is iteratively executed until all the memory cells MC1~MCm pass in programming or until the program loop is performed a predetermined number of times. For example, FIG. 10 illustrates that the program loop iterates until the program voltages reach a level VPMk. As described above, the program voltages and the verify voltages provided to the selected word line WL2 form one program loop.

The memory cells MC1~MCm may be programmed by the program voltages VPM1~VPMk. For example, the memory cells MC2~MCm (except the memory cell MC1 to be programmed to the program state MD may be set to a programmable state. When the program voltages are applied, the threshold voltage of the memory cell MC2 increases from the logic state C1 to the logic state M2. The threshold voltage of the memory cell MC8 increases from the logic state C2 to the logic state M3. The threshold voltage of the memory cell MC7 increases from the logic state C2 to the logic state M4. The threshold voltage of the memory cell MC5 increases from the logic state C3 to the logic state M5. The threshold voltage of the memory cell MC6 increases from the logic state C3 to the logic state M6. The threshold voltage of the memory cell MC4 increases from the logic state C4 to the logic state M7. The threshold voltage of the memory cell MC3 increases from the logic state C4 to the logic state M8.

As described with reference to FIGS. 5 and 6, when one program voltage is provided in one program loop, the memory cells may be program-passed in ascending order of their threshold voltage levels.

When the threshold voltage of the memory cell MC2 reaches the verify voltage VM1, the memory cell MC2 may be program-passed. When a program operation of other memory cells is performed after the program pass of the memory cell MC2, it will cause a coupling to the memory cell MC2. Variations in the threshold voltages by the program operation after the program pass of the memory cells MC2 will be voltages ΔVT2, ΔVT3 and ΔVT4. That is, the coupling effects transferred to the program-passed memory cell MC2 correspond to the threshold voltage variations ΔVT2, ΔVT3 and ΔVT4.

When the threshold voltage of the memory cell MC8 reaches the verify voltage VM2, the memory cell MC8 may be program-passed. The coupling effects transferred to the program-passed memory cell MC2 correspond to the threshold voltage variations ΔVT3 and ΔVT4. When the threshold voltage of the memory cell MC7 reaches the verify voltage VM3, the memory cell MC7 may be program-passed. The coupling effects transferred to the program-passed memory cell MC2 correspond to the threshold voltage variations ΔVT3 and ΔVT4.

When the threshold voltage of the memory cell MC5 reaches the verify voltage VM4, the memory cell MC5 may be program-passed. The coupling effects transferred to the program-passed memory cell MC2 correspond to the threshold voltage variations ΔVT4. When the threshold voltage of the memory cell MC6 reaches the verify voltage VM5, the memory cell MC6 may be program-passed. The coupling effects transferred to the program-passed memory cell MC2 correspond to the threshold voltage variations ΔVT4.

When the threshold voltage of the memory cell MC4 reaches the verify voltage VM6, the memory cell MC4 may be program-passed. When the threshold voltage of the memory cell MC3 reaches the verify voltage VM7, the memory cell MC3 may be program-passed.

The threshold voltage variation ΔVT2, ΔVT3 or ΔVT4 in the MSB program operation is smaller than the threshold voltage variation ΔVT4 in the CSB program operation described with reference to FIGS. 7 and 8. That is, the coupling effect in the MSB program operation is smaller than the coupling effect in the CSB program operation. Thus, it will be understood that the program disturbance in the MSB program operation can be prevented/reduced even when one program voltage is provided in one program loop to perform the program operation.

As described above, the memory cells MC1~MC8 are programmed from one or more logic states C1~C4 to two or more logic states M1~M8 by one program voltage provided in one program loop.

The program method described with reference to FIG. 8 provides at least two program voltages (e.g., the first and second program voltages) to the selected word line WL2 in one program loop. When the first program voltage is applied, the memory cells are programmed to the logic state C2. Herein, a bias time is necessary to program-inhibit the memory cells to be programmed to the logic states C3 and C4. When the second program voltage is applied, the memory cells are programmed to the logic states C3 and C4. Herein, a bias time is necessary to program-inhibit the memory cells to be programmed to the logic state C2.

That is, according to the program method described with reference to FIG. 8, it is necessary to provide at least two program voltages in one program loop to program the memory cells to the logic states C1~C4. On the other hand, according to the program method described with reference to FIG. 10, it is necessary to provide one program voltage in one program loop to program the memory cells to the logic states M1~M8. It will be understood that the program speed of the program method described with reference to FIG. 10 is higher than the program speed of the program method described with reference to FIG. 8. Also, as described above, it will be understood that the coupling reduction effect of the program method described with reference to FIG. 8 is higher than the coupling reduction effect of the program method described with reference to FIG. 10.

The nonvolatile memory device according to the inventive concepts varies the number of program voltages provided to the selected word line in one program loop, according to the threshold voltage variations (i.e., the coupling effects) of the memory cells in the program operation. Thus, like the CSB program operation described with reference to FIG. 8, a program operation for reducing the coupling effect is performed if the threshold voltage variation (i.e., the coupling effect) is greater than a reference value. For example, the program operation described with reference to FIGS. 7 and 8 may be performed. For example, at least two program voltages may be provided to the selected word line in one program loop.

Like the MSB program operation described with reference to FIGS. 9 and 10, a program operation for increasing the program speed is performed if the threshold voltage variation (i.e., the coupling effect) is smaller than the reference value. For example, the program operation described with reference to FIGS. 9 and 10 may be performed. For example, the number of program voltages provided to the selected word line in one program loop may be reduced.

Like the LSB program operation described with reference to FIGS. 5 and 6, a program operation for increasing the program speed is performed if there is no coupling in the word line direction. For example, one program voltage may be provided to the selected word line in one program loop.

For example, the reference value compared with the threshold voltage variation may be determined according to the frequency of occurrence of program disturbances. For example, the program operation for increasing the program speed may be set as a basic program operation. In the program operation for increasing the program speed, the threshold voltage variation (i.e., the coupling effect) at the occurrence of a read error by the coupling effect may be set as the reference value.

For example, the reference value may be detected through an ante-package test and then be stored in the nonvolatile memory device 200. For example, the reference value may be detected through a post-package test and then be stored in the nonvolatile memory device 200. For example, the reference value may be detected and updated in a test mode of the nonvolatile memory device 200.

For example, the number of program voltages provided to the selected word line in one program loop will be set according to the detected reference value. For example, the number of program voltages provided to the selected word line in one program loop of the program operation of the $(n-1)^{th}$ bit (n: any positive integer), starting from the least significant bit LSB of the memory cells, will be set. The nonvolatile memory device 200 may control a program operation of the corresponding page according to the coupling effect in the program operation of the selected page.

Figure 11:
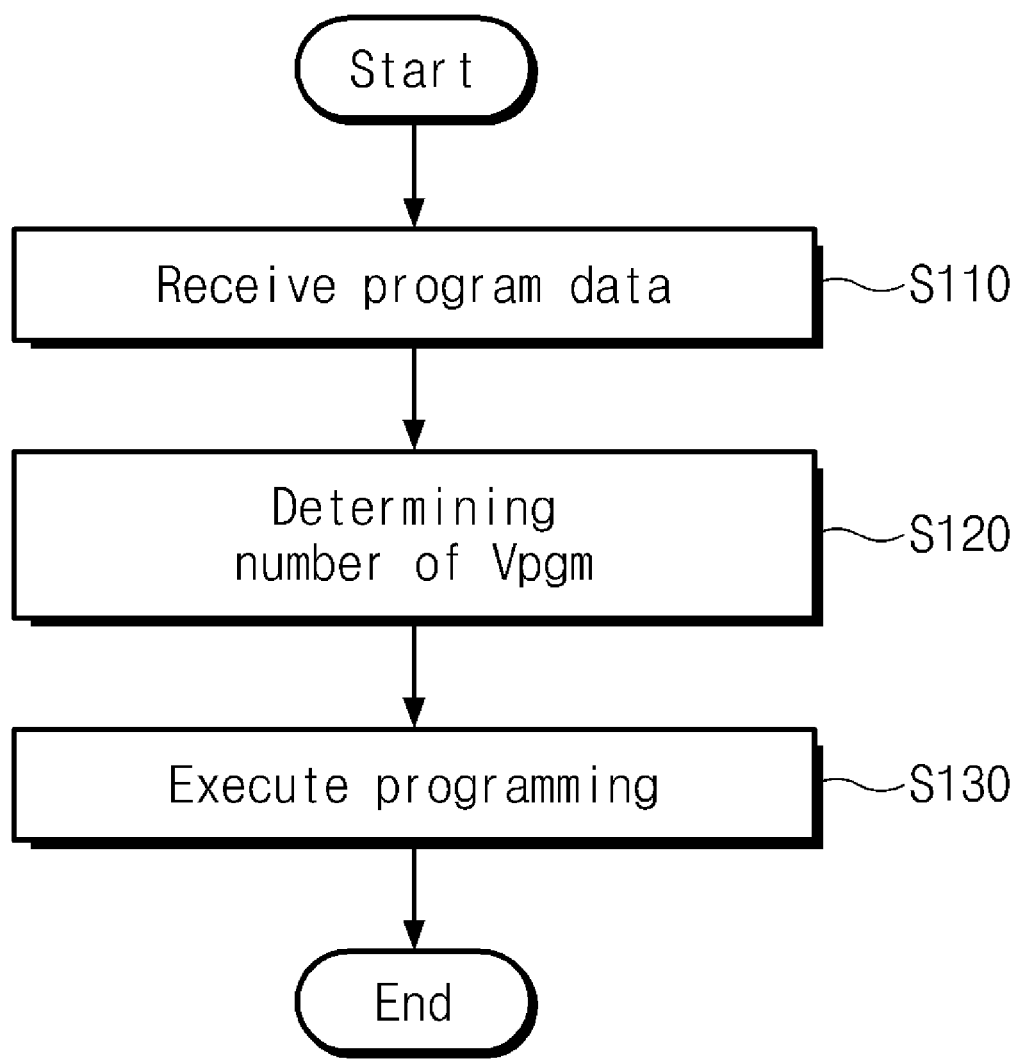
FIG. 11 is a flow chart illustrating a program operation of the nonvolatile memory device according to an embodiment of the inventive concepts.

FIG. 11 is a flow chart illustrating a program operation of the nonvolatile memory device 200 according to an embodiment of the inventive concept.

Referring to FIG. 11, the nonvolatile memory device 200 receives program data in step S110. For example, the program data will be received from the controller 100 of FIG. 100.

In step S120, the number of program voltages is determined. For example, the program controller 251 compares the threshold voltage variation (i.e., the coupling effect) in the program operation of the received program data with the reference value. According to the comparison results, the program controller 251 determines the number of program voltages provided to the selected word line in one program loop of the program operation of the received program data.

For example, if the threshold voltage variation (i.e., the coupling effect) is greater than the reference value, a program operation for reducing the coupling effect will be performed as illustrated in FIGS. 7 and 8. That is, at least two program voltages are provided to the selected word line in one program loop of the program operation (S130).

On the other hand, for example, if the threshold voltage variation (i.e., the coupling effect) is smaller than the reference value, a program operation for increasing the program speed will be performed as illustrated in FIGS. 9 and 10. That is, the number of program voltages provided to the selected word line in one program loop of the program operation will be reduced. For example, at least one program voltage is provided to the selected word line in one program loop of the program operation (S130).

As another example, the program controller 251 will perform a preset program operation according to which bit, starting from the least significant bit LSB of the memory cells, the program data are stored in. For example, as described with reference to FIGS. 9 and 10, a program operation as described with reference to FIGS. 9 and 10 will be performed in the bit program operation with the threshold voltage variation (i.e., the coupling effect) that is smaller than the reference value. For example, as described with reference to FIGS. 7 and 9, a program operation as described with reference to FIGS. 7 and 8 will be performed in the bit program operation with the threshold voltage variation (i.e., the coupling effect) which is greater than the reference value.

For example, the program controller 251 will be set to vary the program operations of the least significant bit, the central significant bit and the most significant bit. For example, the program controller 251 will be set to vary the number of program voltages provided to the selected word line in one program loop of the MSB program operation.

As described above, the nonvolatile memory device 200 according to the inventive concepts may selectively perform the program operation for reducing the coupling effect and the program operation for increasing the program speed according to the size of the coupling effect.

In the above embodiment, a flash memory device storing 3 bits per cell has been exemplified in the description of the inventive concepts. However, it will be understood that the inventive concepts are not limited to a flash memory device storing 3 bits per cell. For example, it will be understood that the inventive concept may be applicable to memory devices storing n-bits per cell (n: any positive integer). Also, the inventive concepts are applicable to a wide variety of nonvolatile memory devices, including ROMs, PROMs, EPROMs, EEPROMs, flash memories, PRAMs, MRAMs, RRAMs, and FRAMs.

Figure 12:
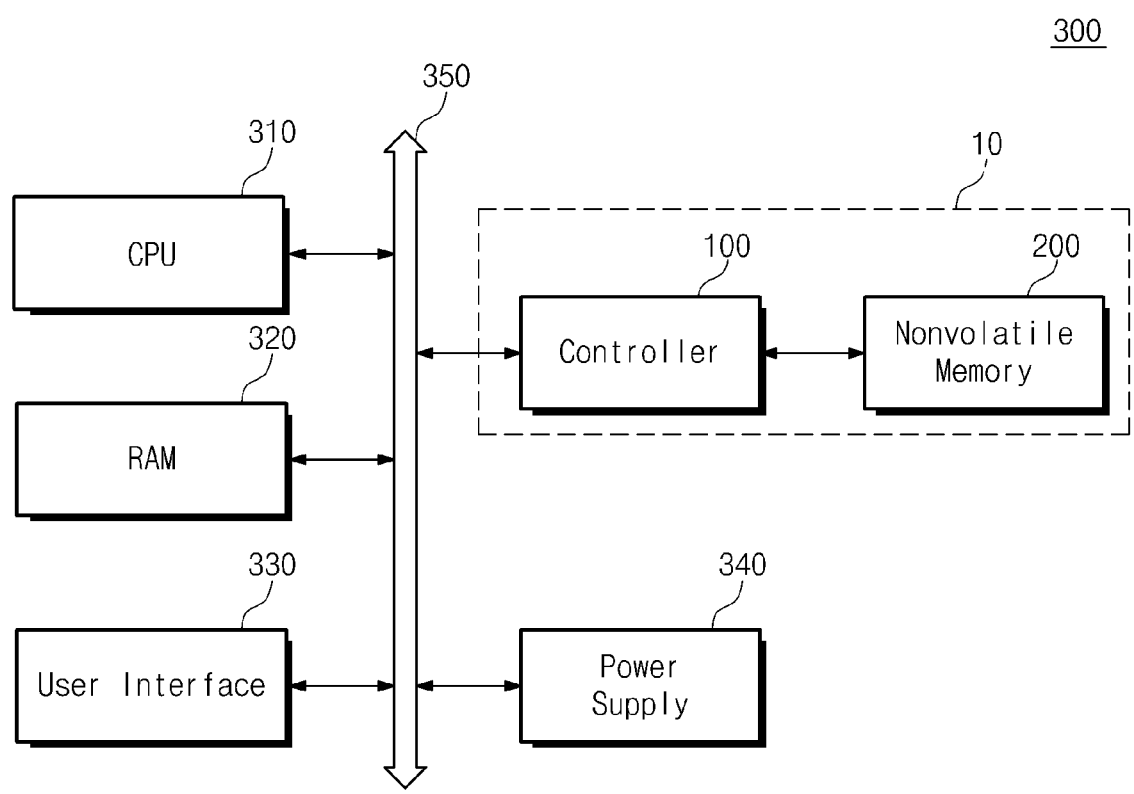
FIG. 12 is a block diagram of a computing system including the memory system of FIG. 1.

FIG. 12 is a block diagram of a computing system 300 including the memory system 10 of FIG. 1.

Referring to FIG. 12, a computing system 300 according to an embodiment of the inventive concepts includes a central processing unit (CPU) 310, a random access memory (RAM) 320, a user interface 330, a power supply unit 340, and a memory system 10.

The memory system 10 is electrically connected through a system bus 350 to the CPU 310, the RAM 320, the user interface 330, and the power supply unit 340. Data, which are provided through the user interface 330 or processed by the CPU 310, are stored in the memory system 10. The memory system 10 includes a controller 100 and a nonvolatile memory device 200.

When the memory system 10 is provided as a solid state disk (SSD), the booting speed of the computing system 300 may increase significantly. Although not illustrated in FIG. 12, those skilled in the art will readily understand that the computing system 300 may further include an application chipset and a camera image processor.

According to the inventive concepts described above, the number of program voltages in the program operation with a coupling effect that is stronger than a reference value is greater than the number of program voltages in the program operation with a coupling effect that is weaker than the reference value, thus reducing the coupling effect and the program time.

The above-disclosed subject matter is to be considered illustrative and not restrictive, and the appended claims are intended to cover all such modifications, enhancements, and other embodiments, which fall within the true spirit and scope of the inventive concept. Thus, to the maximum extent allowed by law, the scope of the inventive concept is to be determined by the broadest permissible interpretation of the following claims and their equivalents, and shall not be restricted or limited by the foregoing detailed description.

What is claimed is:

1. A method for programming a nonvolatile memory device to program memory cells from one or more first logic states to two or more second logic states, the method comprising:
   providing a number of program voltages to a selected word line; and
   providing verify voltages corresponding to the second logic states to the selected word line,
   wherein the number of the program voltages provided to the selected word line varies according to a threshold voltage difference between each of the first logic states and each of the second logic states
   wherein the providing of the program voltages to the selected word line comprises providing first and second program voltages to the selected word line sequentially when the first logic states include an erase state and a first program state and the second logic states include an erase state and second to fourth program states.

2. The method of claim 1, wherein the first program voltage is provided to program the memory cells having the erase state among the first logic states to the second program state.

3. The method of claim 2, wherein the second program voltage is provided to program the memory cells having the first program state to the third or fourth program state.

4. A method for programming a nonvolatile memory device to program memory cells from one or more first logic states to two or more second logic states, the method comprising:
   providing a number of program voltages to a selected word line; and
   providing verify voltages corresponding to the second logic states to the selected word line,
   wherein the number of the program voltages provided to the selected word line varies according to a threshold voltage difference between each of the first logic states and each of the second logic states, and
   wherein the providing of the program voltages to the selected word line comprises providing one program voltage to the selected word line when the first logic states include an erase state and first to third program states and the second logic states include an erase state and fourth to tenth program states.

5. The method of claim 4, further comprising:
   increasing the level of the program voltage when there are program-failed memory cells; and
   providing the program voltage with the increased level to the selected word line.

6. A method for programming a nonvolatile memory device, comprising:
  executing an $(n-1)^{th}$ bit program operation of memory cells, where n is a natural number; and
  executing an $n^{th}$ bit program of the memory cells,
  wherein a threshold voltage of the memory cells varies by a first variation in the $(n-1)^{th}$ bit program operation, the threshold voltage of the memory cells varies by a second variation in the $n^{th}$ bit program operation, and a number of program voltages provided in one program loop of the $n^{th}$ bit program operation and a number of program voltages provided in one program loop of the $(n-1)^{th}$ bit operation vary according to the first and second variations,
  wherein when the first variation exceeds the second variation by at least a predetermined value, the number of program voltages provided in one program loop of the $(n-1)^{th}$ bit program operation is greater than the number of program voltages provided in one program loop of the $n^{th}$ bit program operation.

* * * * *